United States Patent
Stockinger et al.

(10) Patent No.: US 11,056,879 B2
(45) Date of Patent: Jul. 6, 2021

(54) SNAPBACK CLAMPS FOR ESD PROTECTION WITH VOLTAGE LIMITED, CENTRALIZED TRIGGERING SCHEME

(71) Applicant: NXP USA, Inc., Austin, TX (US)

(72) Inventors: Michael A. Stockinger, Austin, TX (US); Marcin Grad, Bemmel (NL); Paul Hendrik Cappon, Wijchen (NL); Sjoerd Bruinsma, Malden (NL)

(73) Assignee: NXP USA, Inc., Austin, TX (US)

( * ) Notice: Subject to any disclaimer, the term of this patent is extended or adjusted under 35 U.S.C. 154(b) by 118 days.

(21) Appl. No.: 16/438,682

(22) Filed: Jun. 12, 2019

(65) Prior Publication Data

US 2020/0395751 A1 Dec. 17, 2020

(51) Int. Cl.
*H02H 9/04* (2006.01)
*H01L 27/02* (2006.01)
*H01L 27/06* (2006.01)

(52) U.S. Cl.
CPC ......... *H02H 9/046* (2013.01); *H01L 27/0277* (2013.01); *H01L 27/0629* (2013.01)

(58) Field of Classification Search
CPC .. H02H 9/046; H01L 27/0629; H01L 27/0277
USPC .......................................................... 361/56
See application file for complete search history.

(56) References Cited

U.S. PATENT DOCUMENTS

| | | | |
|---|---|---|---|
| 5,646,808 A | 7/1997 | Nakayama | |
| 5,707,886 A | 1/1998 | Consiglio et al. | |
| 5,838,146 A | 11/1998 | Singer | |
| 6,249,410 B1 | 6/2001 | Ker et al. | |
| 6,385,021 B1 | 5/2002 | Takeda et al. | |
| 6,501,632 B1 | 12/2002 | Avery et al. | |
| 6,621,673 B2 | 9/2003 | Lin et al. | |
| 6,724,603 B2* | 4/2004 | Miller | H01L 27/0251 361/111 |
| 6,919,602 B2 | 7/2005 | Lin et al. | |
| 6,970,336 B2 | 11/2005 | Stockinger et al. | |
| 8,010,927 B2 | 8/2011 | Gautiiier, Jr. et al. | |
| 8,654,488 B2 | 2/2014 | Huitsing et al. | |
| 8,786,990 B2 | 7/2014 | Prabhu et al. | |
| 9,076,656 B2* | 7/2015 | Etherton | H01L 27/0292 |
| 9,438,030 B2 | 9/2016 | Stockinger | |
| 9,537,308 B2* | 1/2017 | Truong | H02H 3/20 |
| 10,298,215 B2* | 5/2019 | Gao | H01L 27/0285 |

(Continued)

OTHER PUBLICATIONS

Chen, Julian Zhiliang, et al.; "Design Methodology for Optimizing Gate Driven ESD Protection Circuits in Submicron CMOS Processes"; EOS/ESD Symposium 1997; pp. 3A.5.1-3A.5.10: 10 pages.

(Continued)

*Primary Examiner* — Dharti H Patel

(57) ABSTRACT

An apparatus for electrostatic discharge protection. In one embodiment, an integrated circuit (IC) includes a trigger circuit configured to generate a trigger voltage VT in response to an electrostatic discharge (ESD) event. A plurality of metal oxide semiconductor (MOS) transistors are coupled to the trigger circuit. The plurality of MOS transistors are configured to conduct ESD current from a plurality of circuit nodes, respectively, to a ground conductor in response to the trigger circuit generating the trigger voltage VT. A voltage limiter circuit is also included and is configured to limit the trigger voltage VT.

20 Claims, 9 Drawing Sheets

(56) References Cited

U.S. PATENT DOCUMENTS

| | | | |
|---|---|---|---|
| 2003/0043523 | A1 | 3/2003 | Hung et al. |
| 2003/0201457 | A1 | 10/2003 | Lin et al. |
| 2004/0136126 | A1* | 7/2004 | Smith ............... H01L 27/0251 361/56 |
| 2006/0028776 | A1* | 2/2006 | Stockinger ......... H01L 27/0255 361/56 |
| 2007/0097581 | A1* | 5/2007 | Khazhinsky .......... H02H 9/046 361/111 |
| 2008/0247104 | A1* | 10/2008 | Kwak ................ H01L 27/0292 361/56 |
| 2009/0040668 | A1 | 2/2009 | Chen et al. |
| 2009/0323236 | A1* | 12/2009 | Morishita ........... H01L 27/0251 361/56 |
| 2010/0309593 | A1 | 12/2010 | Morishita |
| 2011/0051299 | A1* | 3/2011 | Hiraoka ............. H01L 27/0255 361/56 |
| 2011/0267723 | A1* | 11/2011 | Stockinger ......... H01L 27/0285 361/56 |
| 2013/0120885 | A1* | 5/2013 | Keramat ............ H01L 27/0292 361/56 |
| 2013/0265677 | A1* | 10/2013 | Prabhu ................ H02H 9/046 361/56 |
| 2018/0287378 | A1 | 10/2018 | Sithanandam |
| 2019/0164953 | A1 | 5/2019 | Taghizadeh Kaschani |

OTHER PUBLICATIONS

Duvvury, Charvaka et al.; "Dynamic Gate Coupling of NMOS for Efficient Output ESD Protection"; IEEE/IRPS; 1992; pp. 141-150; 10 pages.

Duvvury, Charvaka et al.: "Substrate Pump NMOS for ESD Protection Applications"; EOS/ESD Symposium 2000; pp. 1A.2.1-1A.2.11; 11 pages.

Isiiizuka, Iiiroyasu et al.; "A Study of Advanced Technique on RC-triggered NMOSFET Power Clamp"; EOS/ESD Symposium 2008; 5 pages.

Ker, Mihg-Dou et al.; "Capacitor-Couple ESD Protection Circuit for Deep-Submicron Low-Voltage CMOS ASIC"; IEEE Transactions on Very Large Scale Integration (VLSI) Systems; vol. 4, No. 3; Sep. 1996; pp. 307-321; 15 pages.

Miller, J.W. et al.; "Engineering the Cascoded NMOS Output Buffer for Maximum $V_{tl}$"; EOS/ESD Symposium 2000; 10 pages.

Olson, Nicholas, et al.; "Small Footprint Trigger Voltage Control Circuit for Mixed-Voltage Applications"; EOS/ESD Symposium 2008; 8 pages.

Ruth, Scott et al.; "A CDM Robust 5V Distributed ESD Clamp Network Leveraging Both Active MOS and Lateral NPN Conduction"; EOS/ESD Symposium 2011; 9 pages.

Stockinger Michael et al.; "Advanced ESD Rail Clamp Network Design for High Voltage CMOS Applications"; EOS/ESD Symposium 2004; 9 pages.

Stockinger Michael et al.; "RC-Triggered ESD Clamp with Low Turn-on Voltage"; IEEE 2017; 4 pages.

Stockinger, Michael et al.; "Boosted and Distributed Rail Clamp Networks for ESD Protection in Advanced CMOS Technologies," EOS/ESD Symposium 2003; 10 pages.

Stockinger, Michael A.; "Circuit for Controlling a Stacked Snapback Clamp"; U.S. Appl. No. 16/267,999, filed Feb. 5, 2019; consisting of Specification, Claims, Abstract, Drawings (27 pages).

Yeh, Chih-Ting et al.; "The Enhancement of Power-Rail ESD Clamp Circuit with Gate-Substrate-Triggered Technique": IEEE Proceedings of 16th IPFA; 2009; 5 pages.

\* cited by examiner

SNAPBACK CLAMPS FOR ESD PROTECTION WITH VOLTAGE LIMITED, CENTRALIZED TRIGGERING SCHEME

BACKGROUND

Electrostatic discharge (ESD) produces sudden and extremely high voltages that can damage an integrated circuit (IC). ESD can originate from many sources. For example, the typical human body can produce ESD of up to 4 kV. For ICs that are designed to operate at 3V, receiving an ESD of such proportions can be devastating.

Clamp devices can protect ICs from ESD events. Clamp devices can be formed on the same substrate that contains the IC to be protected. In response to a sudden rise in voltage due to an ESD event, the clamp device is activated to swiftly discharge ESD current to ground, thereby limiting voltage stress applied to the protected ICs. Clamp devices can function for both unpowered ESD events (i.e., those ESD events occurring when the IC is not powered for normal operation) and powered ESD events (i.e., those ESD events occurring when power is applied to the IC for normal operation). The present disclosure will be described with reference to multiple clamp devices formed on an IC.

BRIEF DESCRIPTION OF THE DRAWINGS

It will be appreciated that for simplicity and clarity of illustration, elements illustrated in the figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION

In the following description numerous specific details are set forth in order to provide a thorough understanding of example embodiments. It should be apparent, however, that example embodiments may be practiced without these specific details or with an equivalent arrangement.

The present disclosure presents multiple snapback clamp devices for ESD protection that are controlled by a centralized trigger circuit. Depending on the type of snapback clamp devices employed, the trigger circuit may or may not include a voltage limiter that limits a trigger voltage provided to the snapback clamp devices. In one embodiment, an IC includes a trigger circuit configured to generate a trigger voltage VT in response to an ESD event. A plurality of snapback clamp devices in the form of metal oxide semiconductor (MOS) transistors are coupled to and controlled by the trigger circuit. The plurality of MOS transistors are configured to conduct ESD current from a plurality of circuit nodes, respectively, to a ground conductor in response to the trigger circuit generating the trigger voltage VT. A voltage limiter circuit may also be included and configured to limit the trigger voltage VT in order to enhance operation of the MOS transistors during an ESD event.

Voltage and current at an IC node can suddenly and sharply rise due to an ESD event. This sudden increase stresses IC components coupled to the node, which can lead to irreversible damage. Snapback clamp devices (hereinafter clamp devices or clamps) can limit the ESD stress by providing a discharge path through which ESD current can be safely conducted to ground.

Large metal-oxide-semiconductor field effect transistors (MOSFETs) can be used as clamp devices. During an ESD event these transistors can be activated to create a low resistance discharge path to ground for ESD current. The discharge path can take any one of several different forms. For example, the discharge path may take form in a conduction channel (i.e., inversion layer) between the source and drain of the MOSFET when the gate voltage exceeds a threshold voltage Vth. A discharge path can also be created by a parasitic bipolar junction transistor (BJT) of the MOSFET, during a mechanism called bipolar snapback, which is more fully described below with respect to FIG. 2. If the parasitic BJT turn-on is initiated by the formation of a conduction channel in the MOSFET, it is called gate-assisted bipolar snapback, which is more fully described below with respect to FIG. 4.

Figure 1:
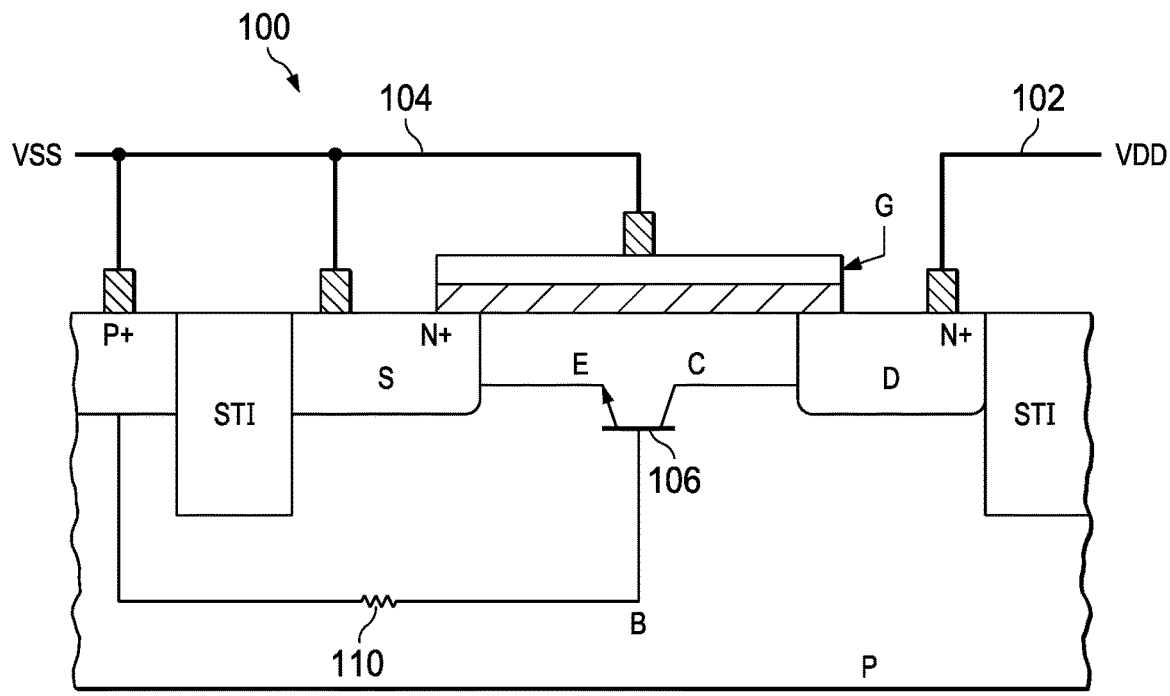
FIG. 1 is a partial cross-sectional view of an N-channel MOS (NMOS) field effect transistor employed as a clamp device.

FIG. 1 illustrates a partial cross-sectional view of a clamp 100 that takes form in an N-channel MOSFET (NMOSFET) formed on an IC. While the present disclosure will be described with respect to clamps that take form in NMOSFETs, clamps may take form in other devices such as P-channel MOSFETs (PMOSFETs). Moreover, clamps may take form in series connected MOSFETs.

NMOSFET clamp (hereinafter NMOS clamp) 100 in FIG. 1 is coupled between supply and ground rails 102 and 104, respectively, which provide supply voltage VDD and ground voltage VSS to other components of the IC (not shown). For purposes of explanation only, VSS is presumed to be 0V. NMOS clamp 100 consists of a source S and a drain D, two highly conducting n-type semiconductor regions that are isolated from the p-type substrate by reversed-biased p-n diodes (not shown). A metal (or poly-crystalline) gate G covers a region between source S and drain D, but is separated from the semiconductor by a gate oxide. The source S is coupled to the ground rail 104, and the drain D is coupled to the supply rail 102. Gate G is also coupled to the ground rail 104, which gives this structure the name "grounded-gate NMOS" (GGNMOS) transistor. NMOS clamp 100 contains an inherent, parasitic bipolar junction transistor (BJT) 106 due to the configuration of its doped material. In FIG. 1 the parasitic BJT is schematically shown with an emitter E effectively coupled to the source S, a collector C effectively coupled to the drain D, and a base B effectively coupled to the substrate body via inherent resistor 110. The substrate body is biased to VSS as shown. Shallow trench isolation (STI) zones 112 and 114 prevent electric current leakage between adjacent components.

Figure 2:
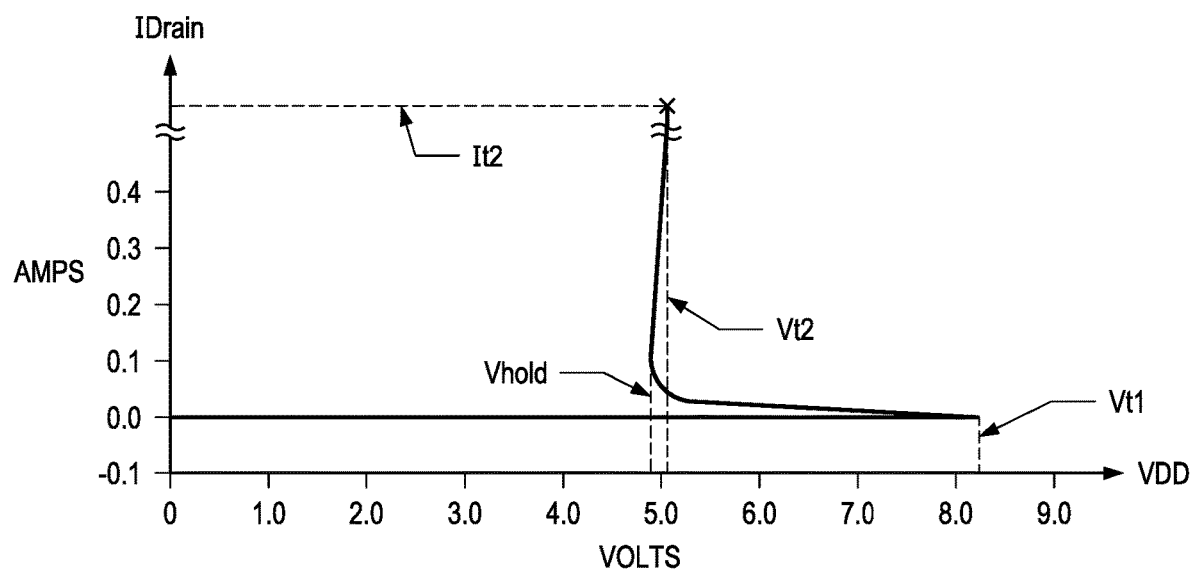
FIG. 2 is a transmission-line-pulse (TLP) diagram that visually demonstrates operational aspects of the clamp device shown in FIG. 1 during an ESD event.

During normal operation (i.e., no ESD event) no conductive path is present between rails 102 and 104 via NMOS clamp 100. However during an ESD event the parasitic BJT can be activated and put into snapback mode when VDD suddenly increases above a snapback voltage Vt1 for the device. More particularly the elevated VDD voltage induces an electric field between drain D and the underlying substrate body that is strong enough to cause mobile charge carriers to energetically strike bound charge carriers in the body, which can then break free. And these new charge carriers can in turn repeat the process, leading to an avalanche current flowing towards the substrate body contact. When this avalanche current is high enough to cause a voltage drop (e.g., 0.7V) across the substrate resistance, the resulting forward biasing of the base B to emitter E junction can activate the parasitic BJT device, allowing large current flow between rails 102 and 104 via the collector C and emitter E. Once the parasitic BJT activates, the high voltage that started the process is no longer necessary to sustain the current because the relatively large collector current causes impact ionization at the collector C to base B junction. Nevertheless, the conduction continues with increasing current, but at a much lower voltage (hereinafter referred to as the holding voltage Vhold). FIG. 2 is a transmission-line-pulse (TLP) diagram that illustrates aspects of bipolar snapback. When VDD increases to a voltage equal to snapback voltage Vt1, the parasitic BJT is activated, the voltage on the supply rail 102 quickly snaps back to Vhold and a relatively large ESD current is conducted to ground. The voltage at the drain may continue to increase with increasing current after snapback. Unfortunately, there is a limit to the current that NMOS clamp 100 can conduct. If current exceeds the limit (hereinafter failure current It2), clamp 100 may be rendered permanently inoperable. Vt2 in FIG. 2 designates the failure voltage corresponding to failure current It2.

Grounded gate NMOS clamps like that shown in FIG. 1 are limited in their ability to protect ICs. For example, the snapback voltage Vt1 may exceed the failure voltage of the IC the clamp is designed to protect. If it does, a sudden increase in VDD due to an ESD event, could damage the IC before voltage snapback. Also, as noted above, if current flow through the clamp 100 exceeds its failure current It2 after snapback, clamp 100 could be damaged and rendered unable to provide protection against subsequent ESD events. This may be of particular concern if a plurality of GGNMOS clamps are configured to operate and conduct ESD current in parallel. One example is a multi-finger GGNMOS device that has a plurality of individual device structures ("fingers") implemented in the same active silicon region, where each finger is like that shown in FIG. 1. A high Vt1 may prevent uniform and simultaneous snapback of the plurality of individual devices because a device that enters snapback first may immediately reduce the effective stress voltage and prevent the other individual devices from reaching their Vt1 altogether before the first device reaches its failure level It2. This effect is also referred to as "current crowding" and may significantly reduce the overall It2 of the plurality of GGNMOS clamps. Other issues are contemplated.

Figure 3A:
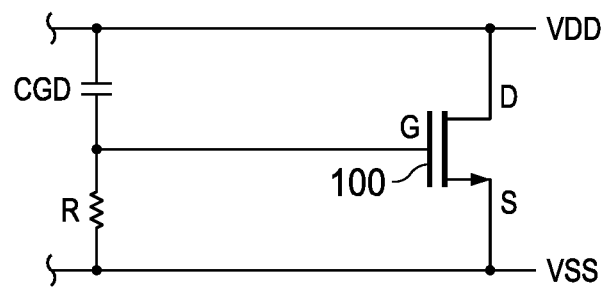
FIGS. 3a-3b are schematic diagrams of trigger circuits for controlling a clamp device similar to that shown in FIG. 1.
Figure 4:
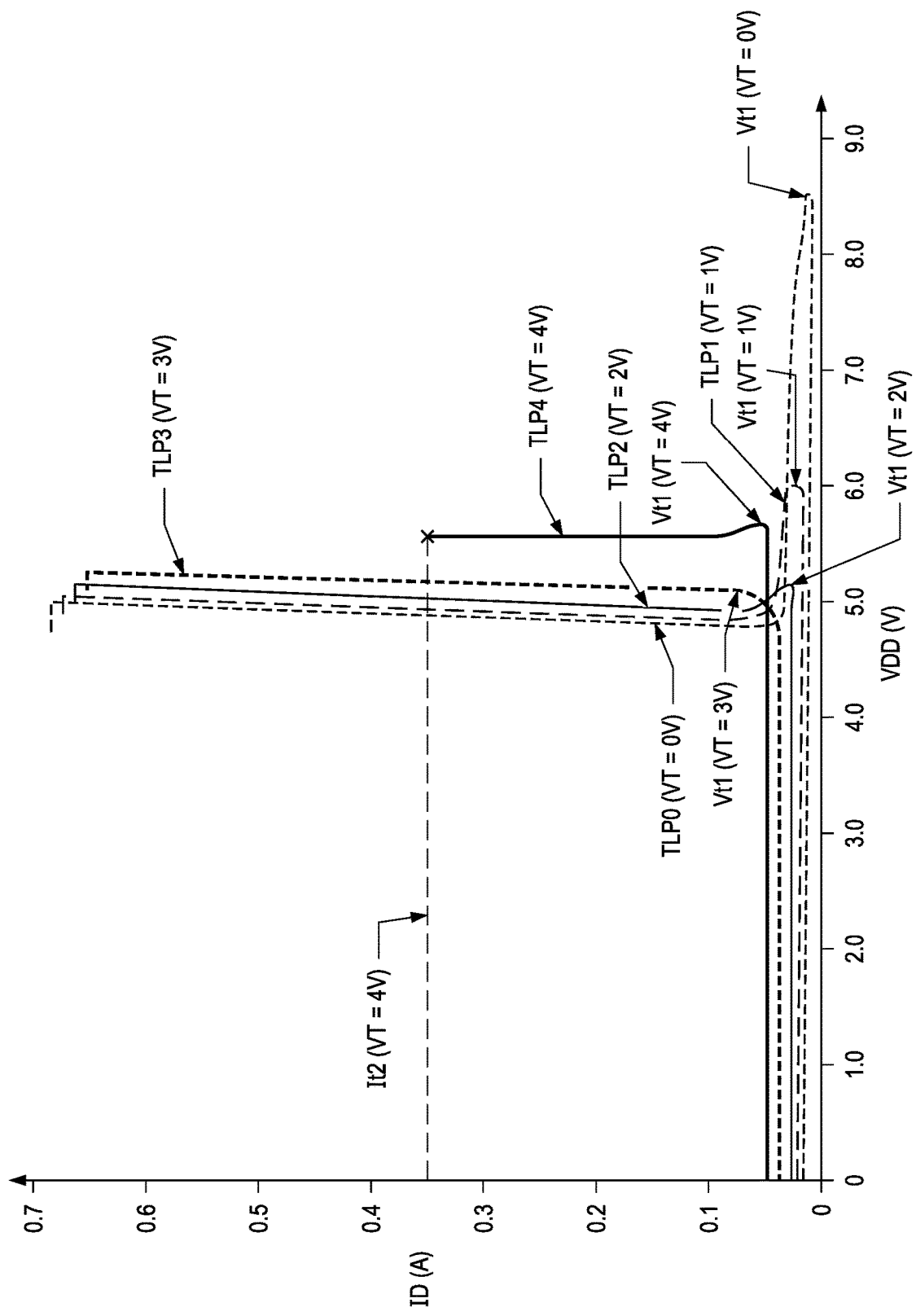
FIG. 4 illustrates sample transmission-line-pulse (TLP) curves for an NMOS field effect clamp

A discharge path to protect against ESD can be created using gate-assisted bipolar snapback. FIG. 3a illustrates a schematic diagram of NMOS clamp 100, and a trigger circuit formed on an IC. The trigger circuit in FIG. 3a enables gate-assisted bipolar snapback and includes a resistor R coupled to gate G. This resistor forms an RC stage with the inherent gate-drain capacitance CGD of NMOS clamp 100. This structure is also referred to as "gate-coupled NMOS" (GCNMOS). In some implementations, an explicit capacitor may be added in parallel with CGD to further increase the time constant of the RC stage and thereby increase the ESD detection range with respect to the voltage rise time of VDD. During an ESD event in which VDD spikes at the drain D, the trigger circuit temporarily applies a positive voltage (hereinafter trigger voltage VT) to gate G if the rise time of the VDD pulse is within the detection range of the trigger circuit. Trigger voltage VT can significantly reduce the Vt1 of the clamp, which in turn protects an IC from voltage overshoot and ensures uniform bipolar conduction of the clamp. FIG. 4 illustrates sample transmission-line-pulse (TLP) curves for an NMOS clamp with various trigger voltages VT to the gate thereof. These TLP curves show that Vt1 drops as VT increases from 0V. For example, Vt1 decreases from 8.5V to approximately 5.0V when VT increases from 0V to 3V. An NMOS clamp with Vt1=5.0V provides ICs with better ESD protection for the reasons described above. However, FIG. 4 also shows that an increase in VT above 3V can produce adverse effects. More particularly, with VT above 3.0V (e.g., VT=4.0V), Vt1 and Vhold increase noticeably, which may affect the ability of clamp 300 to protect the IC. A higher Vhold could increase the voltage across the clamp and thereby increase the stress voltage on the protected circuit node. An increase in VT beyond 3V can also lead to a lower failure current It2. FIG. 4 suggests limiting VT to 1V-3V in order to optimize the ESD protection provided by NMOS clamp 100.

While the trigger circuit shown in FIG. 3a enables gate-assisted snapback, unfortunately it is typically only effective at providing protection during very fast ESD events such as CDM (charge device model). To be effective for slower ESD events (e.g. HBM) the required RC time constant (and therefore the required layout area) would be prohibitively large in order to reduce Vt1 to the optimum level. Another limitation of the configuration in FIG. 3a is that it can only be used for protecting circuits coupled to nodes of a stable DC voltage, like VDD. If used to protect switching nodes, for example I/O pads, the switching current during normal digital signal transitions may be unacceptable because the signal transitions may be falsely detected as ESD events and cause the MOSFET channel of the clamp to conduct.

Figure 3B:
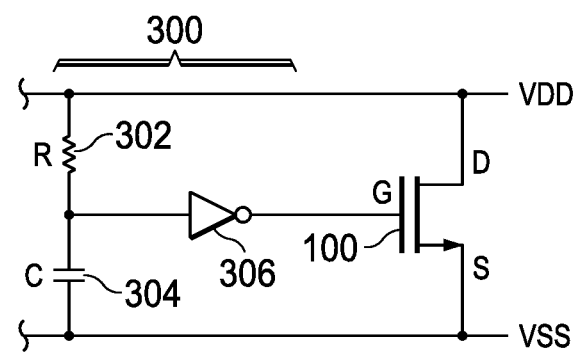

The trigger circuit 300 in FIG. 3b is an alternative to that shown in FIG. 3a. Trigger circuit 300 is formed on an IC with NMOS clamp 100, and includes an RC detection stage (i.e., resistor 302 and capacitor 304), and inverter 306 coupled as shown. Normally, inverter 306 drives the gate G to ground, which maintains NMOS clamp 100 in the inactive state. Inverter 306 applies a large trigger voltage VT (as large as the VDD voltage) to the gate of NMOS clamp 100 during an ESD event, which in turn induces a conduction channel through which ESD current passes to ground. Since VT is large, the VT induced conduction channel has minimized resistance, which enables greater ESD current conduction. However, as described above and below, applying a large VT to the gate G of NMOS clamp 100 places it in less than optimal condition for protecting the IC through utilization of the parasitic BJT. Other trigger circuits may include two or more inverters like 306 of FIG. 3b coupled in series between the RC detection stage and the gate G of the NMOS clamp, and with the RC detection stage coupled between the VDD and VSS rails like in FIG. 3a (for an odd number of inverters) or FIG. 3b (for an even number of inverters). They would also be configured to apply a large VT to the gate G of NMOS clamp 100 during ESD and would therefore suffer from the same problems as described above with regards to FIG. 3B.

Figure 5:
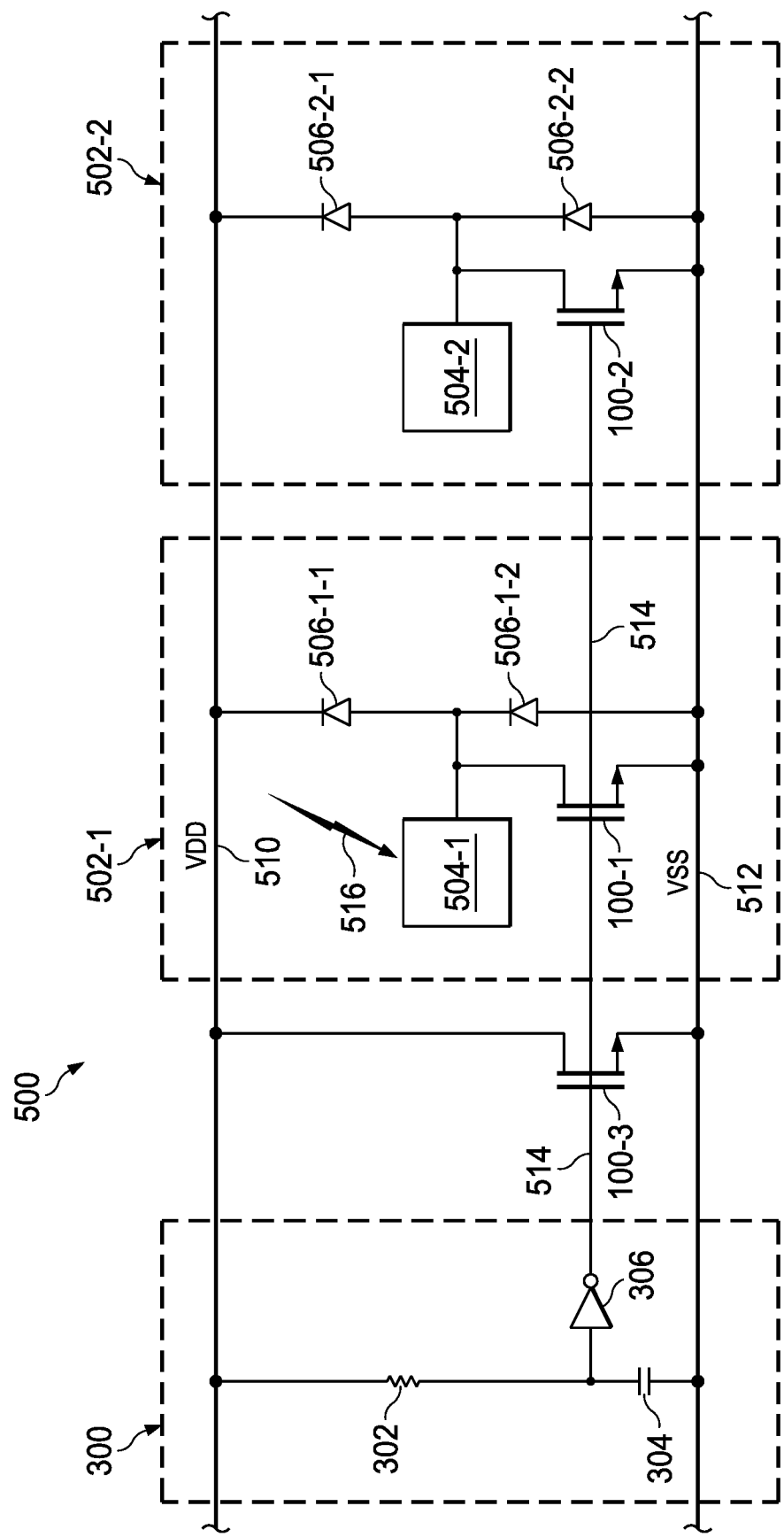
FIG. 5 is a schematic diagram of an IC that includes the trigger circuit of FIG. 3b that controls a plurality of clamp devices similar to that shown in FIG. 1.

Multiple NMOS clamps 100 may provide distributed ESD protection. FIG. 5 illustrates an example IC 500 in which multiple NMOS clamps 100 are controlled by trigger circuit 300. IC 500 includes a plurality of I/O cells 502 (e.g., data I/O cells), each of which includes a pad 504, NMOS clamp 100, and diodes 506. I/O cells 502 are connected between supply rail 510 and ground rail 512. NMOS clamps 100-1 and 100-2 are coupled as shown to I/O pads 504-1 and 504-2, respectively, and ground rail 512. NMOS clamp 100-3 is coupled between supply and ground rails 510 and 512. The trigger voltage VT output of trigger circuit 300 is coupled to the gates of NMOS clamps 100 via trigger line 514.

During normal operation trigger circuit 300 biases the gates of clamps 100 to VSS, and as a result none of the NMOS clamps 100 are activated. IC 500 may experience an ESD event. For example an ESD event 516 may occur at I/O pad 504-1, which suddenly increases VDD on supply rail 510 via diode 506-1-1. Trigger circuit 300 detects the sudden increase of VDD, and in response drives the gates of NMOS clamps 100 with a high trigger voltage VT (e.g., VT>3.0V). NMOS clamps 100 activate and create multiple low resistance conduction channels between their sources and drains, through which ESD current is conducted in parallel to ground rail 512.

Although a high voltage VT induces low resistance conduction channels in the NMOS clamps 100 through which ESD current is discharged to ground, the high voltage VT may increase the snapback voltage Vt1. The spike in VDD and the stress voltage on I/O pad 504-1 during the ESD event may cause damage to the IC before BJT snapback is activated. In addition, a high trigger voltage VT may lead to a decrease in failure current It2 and an increase in holding voltage Vhold, additional factors that can adversely affect the ability of NMOS clamps 100 to protect IC 500 during the ESD event.

The present disclosure describes a trigger circuit that generates a trigger voltage VT for optimizing multiple NMOS clamps of an IC during an ESD event. The trigger voltage VT is applied to the gate or body of the NMOS clamps. For purposes of explanation, the present disclosure will be described with reference to a trigger circuit that applies VT to the gates of multiple NMOS clamps, except where noted.

Figure 6:
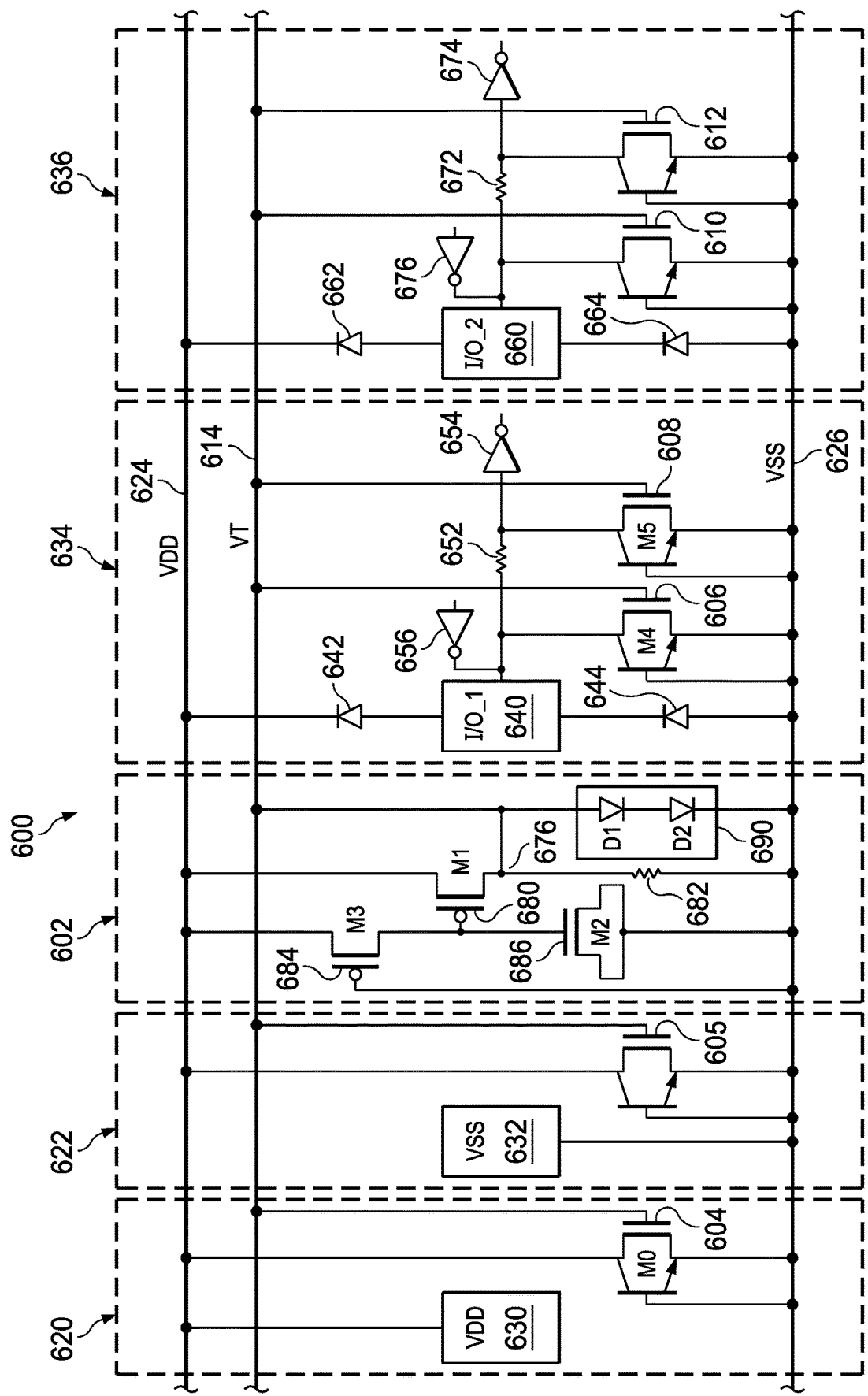
FIG. 6 is a schematic diagram of an IC employing one embodiment of the present disclosure.

FIG. 6 illustrates relevant components of an IC 600 that includes a trigger circuit 602 for controlling multiple NMOS clamps 604-612 according to one embodiment of the present disclosure. Each of the NMOS clamps 604-612 take form in an NMOS clamp similar to that shown in FIG. 1 and may be formed as a multi-finger device. NMOS clamps 604-612 are shown schematically along with their parasitic BJTs in FIG. 6. The base of the BJT transistors, and thus the bodies of the NMOS clamps 604-612, are connected to ground rail 626. NMOS clamps 604-612, or the NMOS clamps in FIGS. 7 and 8 (704-712 and 604-612), may have un-silicided drain regions (silicide-blocked drains) to maximize failure current It2. Un-silicided drain regions may also promote uniform activation of large NMOS clamps including those that have multi-finger components.

Trigger circuit 602 applies a trigger voltage VT to the gates of clamps 604-612 via trigger line 614. During normal operation, VT=0V, and NMOS clamps 604-612 are inactive. However, trigger circuit 602 applies a VT>0V to the gates of NMOS clamps 604-612 in response to detecting an ESD event as will be more fully described below.

Trigger circuit 602 controls multiple NMOS clamps 604-612, which provide ESD protection to respective circuit nodes such as I/O pads or supply rails. NMOS clamps 604 and 605 are contained in cells 620 and 622, respectively, and are coupled between supply rail 624 and ground rail 626. Cells 620 and 622 include pads 630 and 632 for receiving supply voltage VDD and ground voltage VSS, respectively. Clamps 606 and 608 are contained in I/O cell 634, and clamps 610 and 612 are contained in I/O cell 636. Although not shown, IC circuit 600 may include additional I/O cells that contain components similar to that shown in I/O cells 634 and 636. IC circuit 600 may also include additional power or ground supply cells similar to 620 and 622, respectively.

I/O cell 634 includes I/O pad 640 coupled between supply rail 624 and ground rail 626 via diodes 642 and 644, respectively, as shown. I/O pad 640 is configured to receive a first digital signal I/O_1. I/O pad 640 may receive I/O_1 from a circuit internal (not shown) to IC 600 via output buffer 656, or I/O_1 is subsequently transferred to a circuit (not shown) internal to IC 600 via resistor 652 and input buffer 654. NMOS clamp 606 is coupled as shown between I/O pad 640 and ground rail 626, while NMOS clamp 608 is coupled as shown between input buffer 654 and ground rail 626.

I/O cell 636 is substantially similar to I/O cell 634. I/O cell 636 includes I/O pad 660 coupled between supply rail 624 and ground rail 626 via diodes 662 and 664, respectively, as shown. I/O pad 660 may receive a second digital signal I/O_2 from a circuit internal (not shown) to IC 600 via output buffer 676, or I/O pad 660 may receive I/O_2 from a circuit (not shown) external to IC 600. Externally received I/O_2 is subsequently transferred to an internal circuit (not shown) of IC 600 via resistor 672 and input buffer 674. NMOS clamp 610 is coupled as shown between I/O pad 660 and ground rail 626, while NMOS clamp 612 is coupled as shown between input buffer 674 and ground rail 626.

Trigger circuit 602 includes an output node 676, which in turn is coupled to the gates of NMOS clamps 604-612 via trigger line 614. PMOS transistor 680 is connected to resistor 682, the combination of which forms an inverter stage and is coupled between supply rail 624 and ground rail 626 as shown. PMOS transistor 684 is connected to capacitor 686, the combination of which are coupled between rails 624 and 626 as shown. In FIG. 6, capacitor 686 takes form in a NMOS transistor with its source and drain coupled together and coupled to ground rail 626 as shown. Trigger circuit 602 also includes a voltage limiter circuit 690 that takes form in series connected diodes D1 and D2, it being understood the voltage limiter should not be limited thereto. For example, the limiter circuit 690 may take form in a single diode, three or more diodes, a MOSFET diode, a Zener diode, or a resistive voltage divider.

Trigger circuit 602 provides trigger voltage VT at output node 676. During normal operation of IC 600, PMOS transistor 680 is inactive, and as a result resistor 682 pulls output 676, and thus the gates of NMOS clamps 604-612 to VSS. In other words, VT=VSS=0V during normal operation of IC 600. With the gates of clamps 604-612 at 0V, clamps 604-612 are inactive. IC 600 may receive ESD via any one or more of pads 630, 640 and 660. When that happens, voltage VDD on supply rail 624 may suddenly and dramatically increase. Trigger circuit 602 detects the ESD event. More particularly, the sudden increase in VDD activates PMOS transistor 684, the gate of which is biased at VSS=0V. The voltage at the gate of PMOS transistor 680 rises with the activation of PMOS transistor 684. However, capacitor 686 delays the rise of the voltage at the gate of PMOS transistor 680 relative to that of VDD. As a result, PMOS transistor 680 activates and conducts current to the ground rail 626 via resistor 682, which in turn increases VT at output node 676. PMOS transistor 680 and resistor 682 form a buffer or inverter stage that can strongly drive trigger line 614 during an ESD event. Since output node 676 is connected to the gates of NMOS clamps 604-612, VT will induce a conductive channel in NMOS clamps 604-612 when VT exceeds the threshold voltage Vth Importantly, VT will also reduce Vt1 of NMOS clamps 604-612, which places NMOS clamps 604-612 in better condition to protect IC 600 through BJT snapback conduction of ESD current to ground rail 626. VT is limited by voltage limiter 690 to a predetermined value so that the effective Vt1 and Vhold values of NMOS clamps 604-612 do not increase to unacceptable levels or their It2 values decrease to unacceptable levels. In other words voltage limiter 690 limits VT to a value (e.g., 1-3 V) so that clamps 604-612 enter BJT snapback conduction mode readily and discharge ESD current through activated parasitic BJTs while maintaining It2 and Vhold at reasonable levels.

Figure 3C:
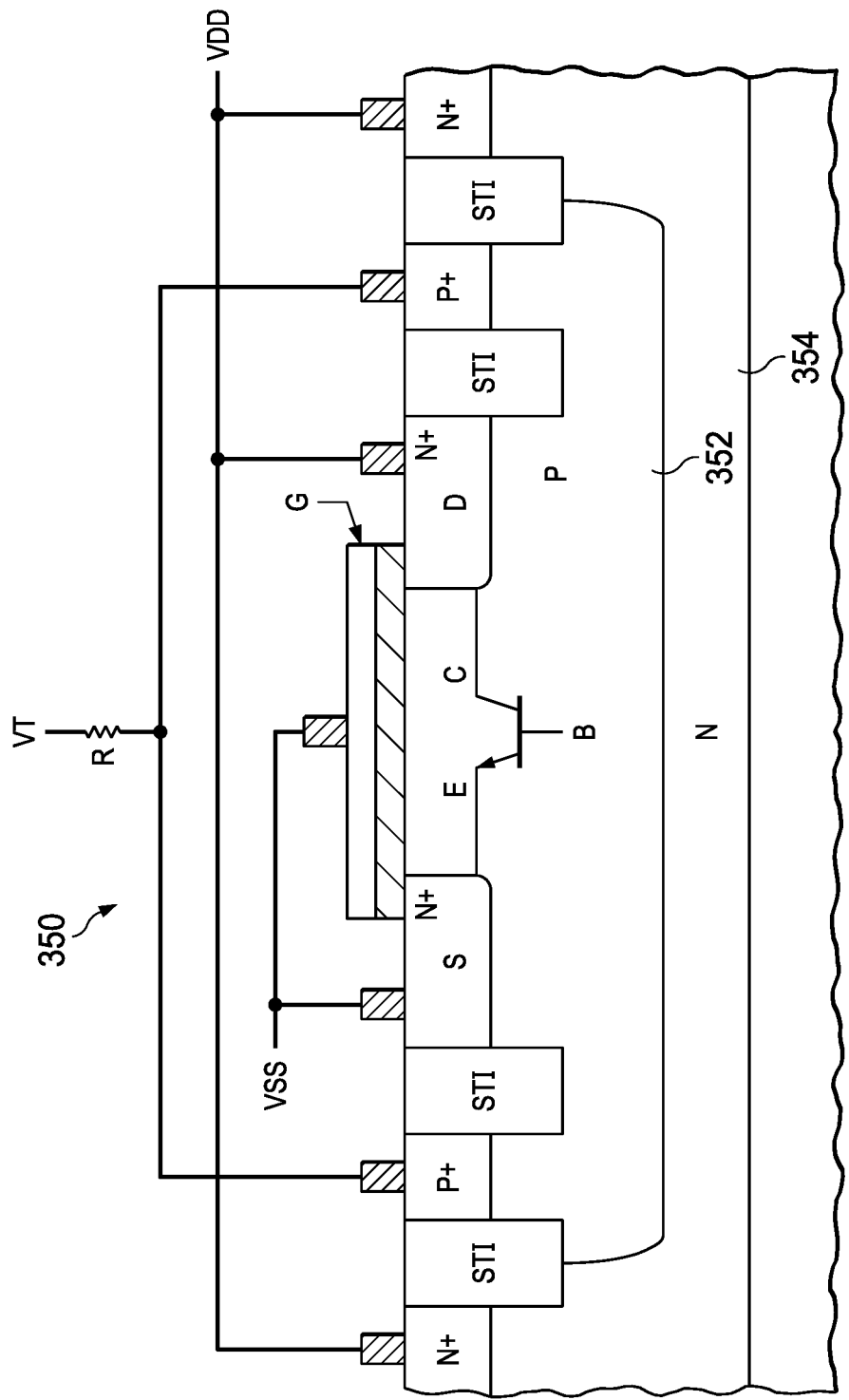
FIG. 3c is a partial cross-sectional view of another NMOS field effect transistor employed as a clamp device.
Figure 7:
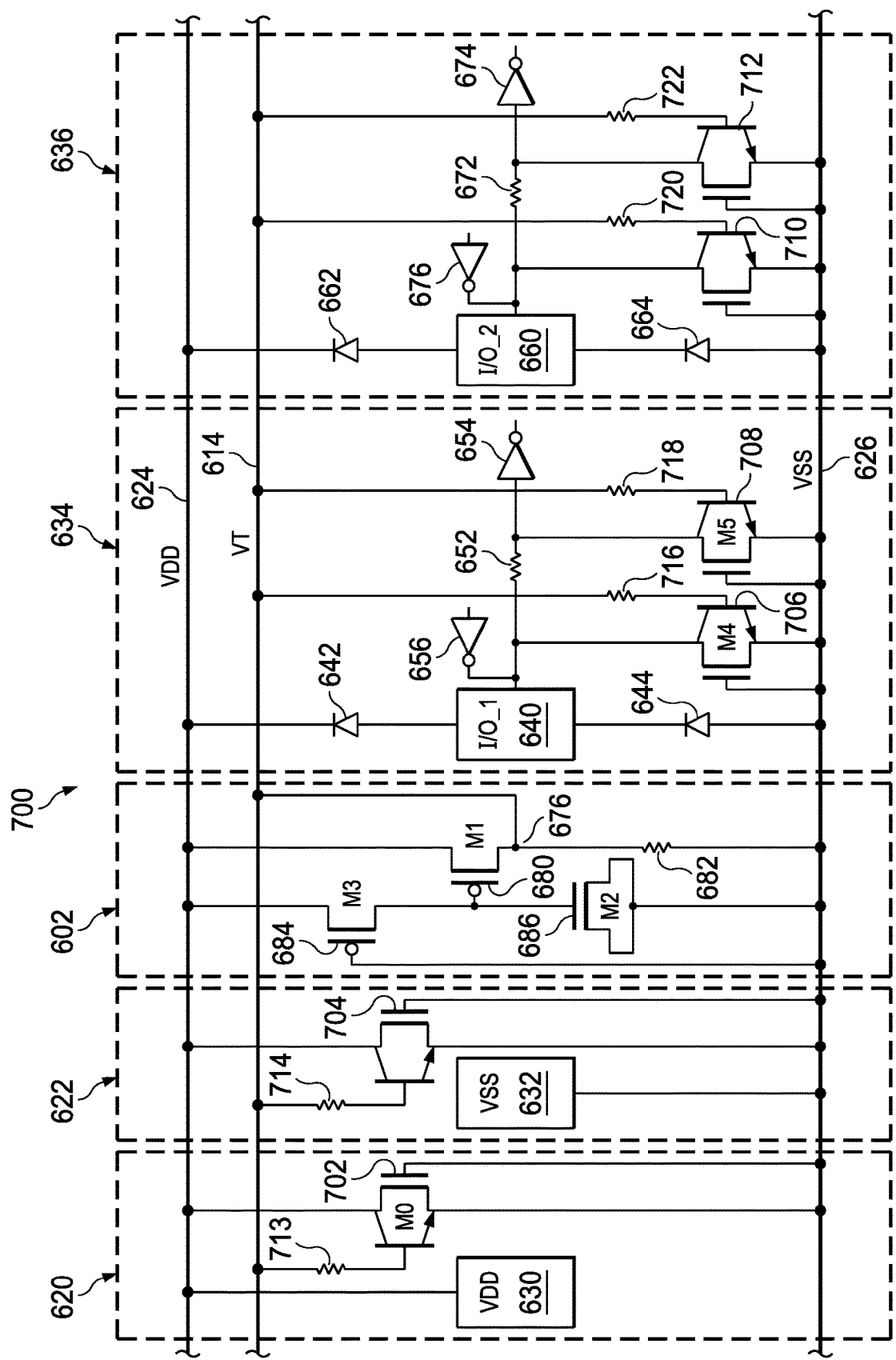
FIG. 7 is a schematic diagram of an IC employing another embodiment of the present disclosure.

FIG. 7 illustrates an alternative embodiment of the present disclosure. More particularly, FIG. 7 shows an IC 700 that employs many of the same components of IC 600. For example, IC 700 employs the same trigger circuit 602 of IC 600 shown in FIG. 6, but without limiter 690. Importantly, the NMOS clamps 604-612 of IC 600 are replaced with NMOS clamps 702-712. FIG. 3c illustrates an example of the NMOS clamp that can be employed in FIG. 7. NMOS clamp 350 includes source S and drain D formed in an isolated P-well (IPW 352). The gate G and source S of the NMOS clamps in FIGS. 7 and 3c are tied to the ground rail (VSS). IPW 352, and thus the base B of the parasitic BJT, is controlled by VT via resistors 713-722 of FIG. 7 (resistor R of FIG. 3c.) In the embodiment shown N well 354 is biased to VDD. During normal operation VT is maintained at 0V and the NMOS clamps 350, and 702-712 are inactive. During an ESD event trigger circuit 602 applies a positive VT, which in turn injects current into IPW 352 and thus the base B via respective resistors. The injected current lowers the threshold Vt1 at which the parasitic BJTs snapback during the ESD. This mechanism is often referred to as well pumping. IC 700 lacks the voltage limiter 690 of FIG. 6. In this embodiment, parasitic diodes of the source to body junctions of NMOS clamps 702-712 in series with resistors 713-722, respectively, can limit the voltages applied to the IPWs to a diode drop.

Figure 8:
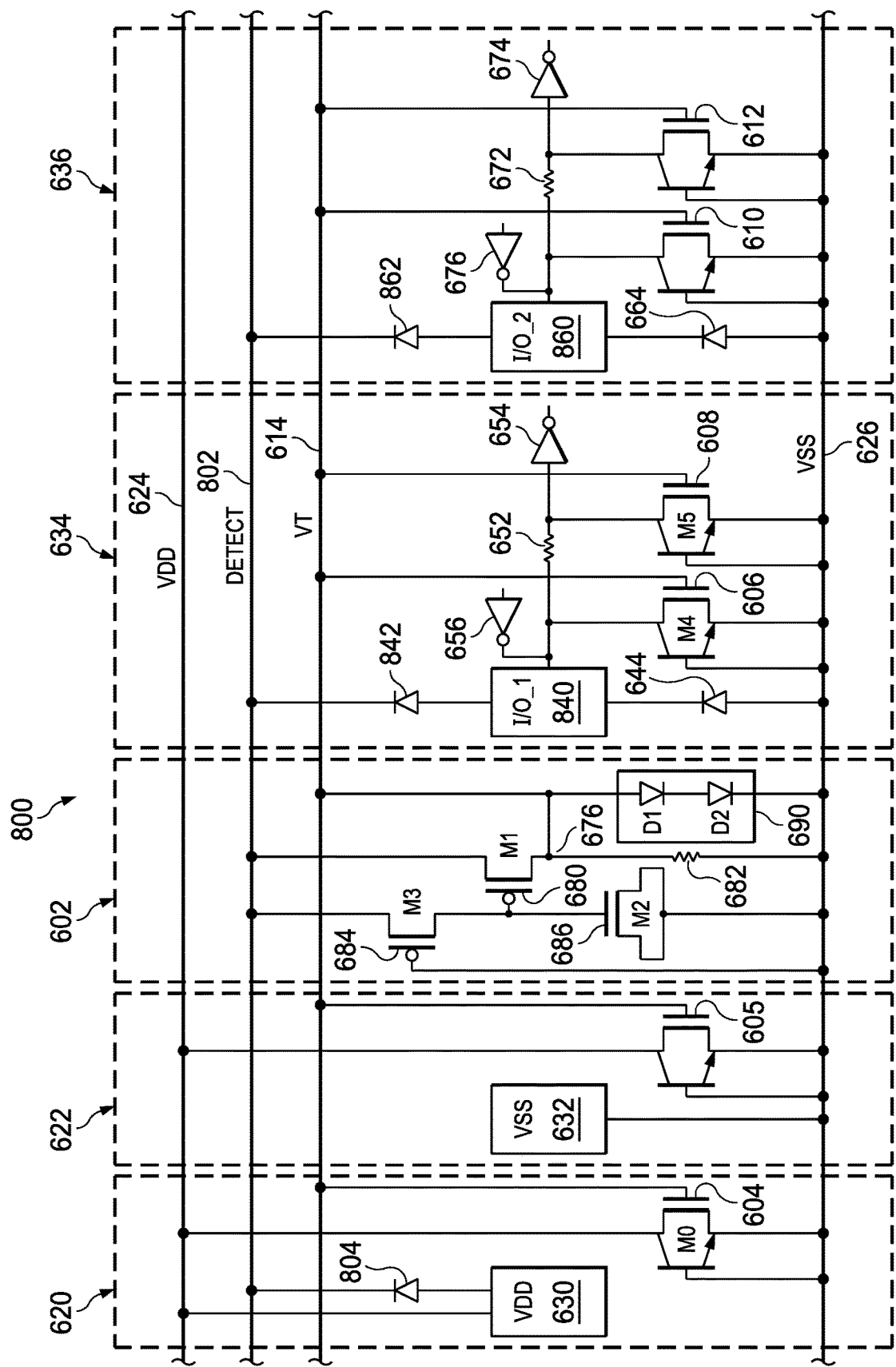
FIG. 8 is a schematic diagram of an IC employing yet another embodiment of the present disclosure.

FIG. 8 illustrates the IC shown in FIG. 6, but with an additional detect line that provides a supply voltage to trigger 602. More particularly FIG. 8 illustrates the IC 600 shown in FIG. 6 with detect line 802 and diode 804 added thereto. In FIG. 6 the VDD pad 630 is coupled to supply rail 624. In contrast, VDD pad 630 in FIG. 8 is coupled to both supply rail 624 and to line 802 via diode 804. In FIG. 6, I/O pads 640 and 660 are coupled to supply rail 624 via diodes 642 and 662, respectively. In FIG. 8 I/O pads 840 and 860 are coupled to detect line 802 via diodes 842 and 862, respectively, but not to supply rail 624. In one embodiment, this may allow the voltages on I/O pads 840 and 860 in FIG. 8 to exceed the VDD voltage (voltage-tolerant I/O pads) during normal chip operation. Diodes 804, 842, and 862 can be relatively small compared to diodes 642 and 662, because they are only used for detection of an ESD event, and not in a primary ESD discharge path. Lastly, and perhaps most importantly, PMOS transistors 680 and 684 of trigger circuit 602 are coupled to detect line 802 as shown instead of supply rail 624.

Trigger circuit 602 controls NMOS clamps 604-612 in IC 800 in much the same manner as described above with reference to FIG. 6. VDD pad 630 or one of I/O pads 840 or 860, could be subjected to an ESD event that suddenly drives up the voltage on detect line 802. The sudden increase in voltage on detect line 802 activates PMOS transistor 684, the gate of which is biased at VSS=0V. Voltage at the gate of PMOS transistor 680 rises with the activation of PMOS transistor 684. However, capacitor 686 delays the rise of the voltage at the gate of PMOS transistor 680 relative to that of VDD. As a result, PMOS transistor 680 activates and conducts current to the ground rail via resistor 682. This in turn increases VT at output node 676 and the gates of clamps 604-612, which assists in putting NMOS clamps 604-612 into optimal snapback conduction mode as described above. The increase in VT is limited by voltage limiter 690 so that It2 and Vhold of NMOS clamps 604-612 are maintained at reasonable levels.

In FIGS. 6 and 7 I/O pads 640 and 660 are directly protected from a positive ESD event by NMOS clamps 606 and 610, or 706 and 710 respectively. Because in FIG. 8 no diodes couple I/O pads 840 and 860 to supply rail 624, the implementation of FIG. 8 enables voltage-tolerant and fail-safe I/O pads, i.e. the I/O signals at pads 840 and 860 of FIG. 8 can be asserted high when VDD is not present (fail-safe) or they can exceed the VDD voltage in general (voltage-tolerant). This embodiment may require special design techniques for the output buffers 656 and 676 (e.g. well biasing and gate tracking if a PMOS buffer is present) to prevent any parasitic diode from an I/O pad to supply rail 624. Similar to the implementation of FIG. 7, some or all of clamps 604-612 in FIG. 8 could be replaced with the clamp shown in FIG. 5, the IPWs of which are controlled by VT. In one design, gate-assisted clamps and well-pumped clamps may be used on the same IC and receive the same trigger voltage VT via trigger line 614. In yet another implementation, VT may pass through one or more inverter stages that are placed locally in I/O cell 634, for example, before reaching the gate of NMOS clamp 606 (or the IPW of NMOS clamp 706). In such case, the voltage limiting circuit 690 (e.g. D1, D2) may also be placed locally with the clamp rather than centrally with trigger circuit 602. If a local inverter is used, the logic state of VT may also be inverted, meaning that it would be "high" during normal chip operation and "low" during an ESD event. This could be achieved by flipping the RC stage of trigger circuit 602 or by using an even number of inverter stages in trigger circuit 602. In yet another embodiment, a detect line 802 and diodes 804, 842, and 862 may be added to IC 600 of FIG. 6, and trigger circuit 602 may receive its power supply from the detect line instead of VDD, i.e. PMOS devices 680 and 684 may be coupled to the detect line instead of VDD. This may be useful if multiple trigger circuits were used for driving a common VT bus.

Figure 9:
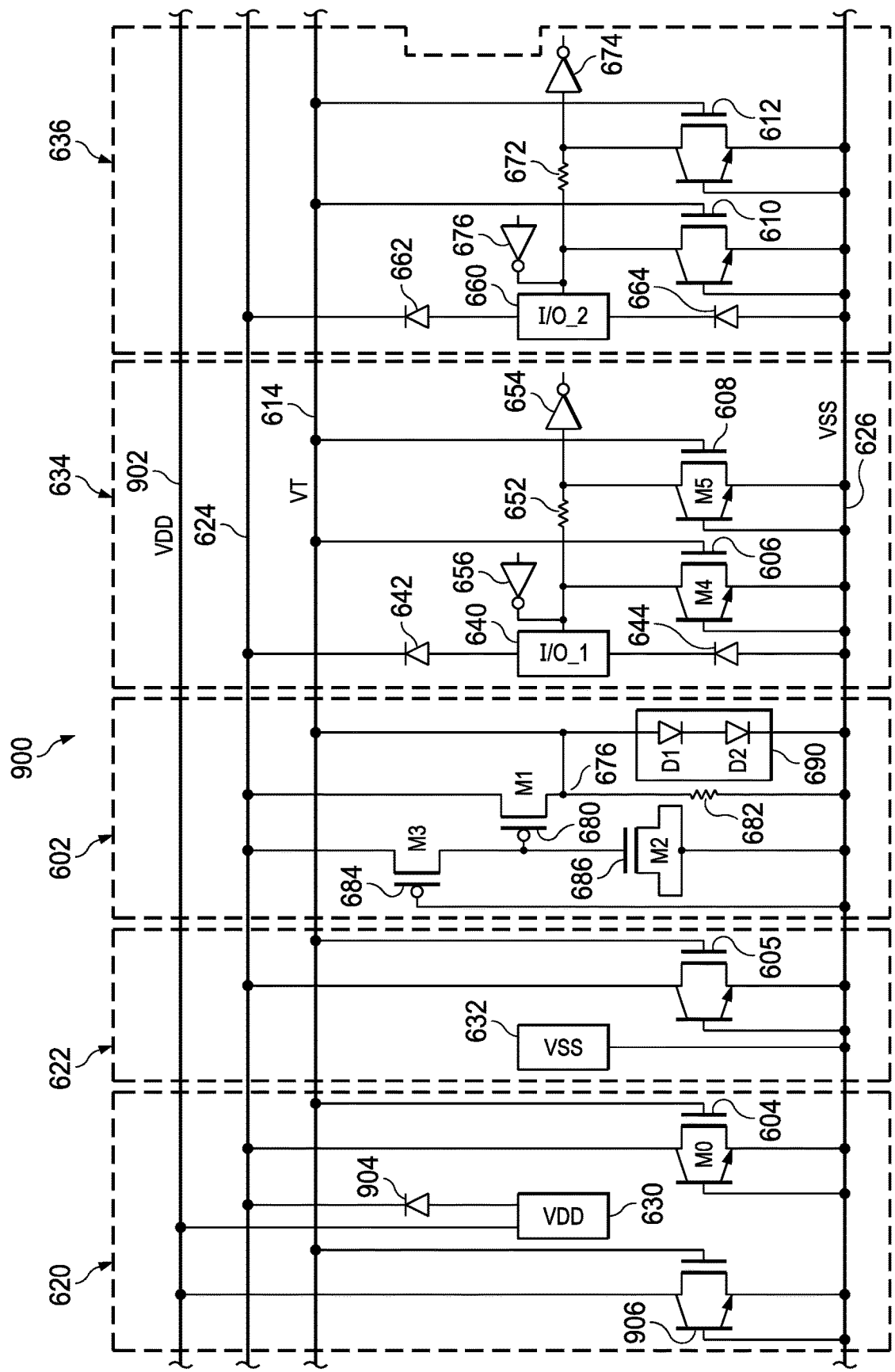
FIG. 9 is a schematic diagram of an IC employing still another embodiment of the present disclosure.

FIG. 9 illustrates the IC shown in FIG. 8, but with substantial changes thereto. In FIG. 9, supply rail 624 may be an internal IC supply rail without direct connection to external pad 630. In FIG. 9, supply rail 624 is coupled to external VDD pad 630 via diode 904. This internal IC supply rail 624 may serve as an ESD protection supply rail for the I/O pads in FIG. 9. The VDD voltage from external VDD pad 630 may be made available to the I/O pads via VDD supply rail 902, which may have its own ESD clamp 906 to ground rail 626. In another embodiment, ESD clamp 906 may be omitted, and VDD pad 630 may be protected similar to I/O pad 640, with ESD protection diode 904 to ESD protection rail 624 and with another ESD protection diode (not shown, similar to diode 644 of I/O pad 640) to ground rail 626. The internal ESD protection supply 624 rail may also enable voltage-tolerant and fail-safe I/O pads due to the decoupling of the VDD supply rail and the ESD protection supply rail.

In yet another embodiment, the IC may include an analog signal pad to receive an analog signal from a circuit external to the IC or provide an analog signal from the IC to an external circuit. For ESD protection, the analog signal pad may be configured similar to I/O pad 640 in FIG. 6 (with diodes 642 and 644 and NMOS clamp 606), I/O pad 640 in FIG. 7 (with diodes 642 and 644 and NMOS clamp 706), or I/O pad 840 in FIG. 8 (with diodes 842 and 644 and NMOS clamp 606), but without digital output or input buffers.

Returning back to FIG. 6, trigger circuit 602 controls the gates of clamps 604-612. FIG. 7 includes a trigger circuit that controls the base B of clamps 702-712 without a voltage limiter 690. In both FIGS. 6 and 7 the trigger circuit is directly coupled to VDD pad 630 via supply rail 624. FIGS. 8 and 9 illustrate the IC shown in FIG. 6, but with additional features. These additional features could also be added to the IC of FIG. 7. Comparing FIG. 8 to FIG. 6, the IC of FIG. 8 includes a detect line 802 coupled to VDD pad 630 via diode 804 and coupled to I/O pads 840 and 860 via diodes 842 and 862, respectively. In FIG. 8, the trigger circuit 602 is coupled to the detect line 802 instead of VDD supply rail 624. The IC of FIG. 7 could be modified to have similar features as the IC of FIG. 8. To illustrate, a detect line could be added, and ESD protection diodes 642 and 662 could be replaced by two smaller diodes that couple the I/O pads to the detect line instead of the VDD supply rail. A diode coupling VDD pad 630 to the detect line could also be added, and the trigger circuit could be coupled to the detect line instead of the VDD supply rail. Comparing FIG. 9 to FIG. 6, the IC of FIG. 9 includes a separate VDD supply rail 902 and an additional ESD diode 904 that couples the VDD pad to the internal ESD protection supply rail 624. An ESD clamp 906 provides direct ESD protection for the VDD rail. The IC of FIG. 7 could be modified to have similar features as the IC of FIG. 9. To illustrate, supply rail 624 could be used as an internal ESD protection supply rail. A separate VDD supply rail could be added, and the VDD pad could be coupled to the ESD protection supply rail via an added ESD diode. An ESD clamp, with its base B coupled to the VT line via a base resistor, could be added onto the VDD supply rail for its direct ESD protection.

Accordingly, an apparatus is disclosed for providing ESD protection to an IC. The apparatus may include several clamp devices and a centralized trigger circuit that controls the snapback clamp devices. Depending on the type of clamp devices employed, the trigger circuit may include a voltage limiter that limits a trigger voltage provided to the clamp devices. In one embodiment, an IC includes a trigger circuit configured to generate a trigger voltage VT in response to an electrostatic discharge (ESD) event, a voltage limiter circuit configured to limit the trigger voltage VT, a plurality of metal oxide semiconductor (MOS) transistors coupled to the trigger circuit, wherein the plurality of MOS transistors are configured to conduct ESD current from a plurality of circuit nodes, respectively, to a first conductor in response to the trigger circuit generating the trigger voltage VT. The IC may further include a conductor, wherein the conductor is configured to provide the trigger voltage VT to gates of the plurality of MOS transistors. The plurality of MOS transistors may take form in a plurality of NMOS transistors. The IC may further include a second conductor for providing a voltage, an input/output (I/O) pad configured to receive a signal, wherein a drain and a source of a first of the plurality of NMOS transistors are coupled to the second and the first conductor, respectively, and wherein a drain and source of a second of the plurality of NMOS transistors are coupled to the I/O pad and the first conductor, respectively. The drain of the second of the plurality of NMOS transistors may be coupled to the I/O pad via a resistor. The IC of this embodiment may include a voltage pad coupled to the second conductor and configured to receive the voltage from a device external to the IC, wherein the trigger circuit is coupled between the first and second conductors, and wherein the ESD event is defined as an increase in voltage on the second conductor before the voltage pad receives the voltage from the external device, or before the I/O pad receives the signal. The IC of this embodiment may include second and third conductors, a voltage pad configured to receive a voltage from a device external to the IC, an input/output (I/O) pad configured to receive a signal, a diode coupled between the I/O pad and the third conductor, wherein the voltage pad is directly coupled to the second conductor and indirectly coupled to the third conductor via another diode, and wherein the trigger circuit is coupled between the third conductor and the first conductor. The drain and source of a first of the plurality of NMOS transistors may be coupled to the second conductor and the first conductor, respectively, and wherein a drain and source of a second of the plurality of NMOS transistors may be coupled to the I/O pad and the first conductor, respectively. Alternatively, a drain and source of a first of the plurality of NMOS transistors may be coupled to the third conductor and the first conductor, respectively, and a drain and source of a second of the plurality of NMOS transistors may be coupled to the I/O pad and the first conductor, respectively. In another alternative, the trigger circuit is configured to detect an electrostatic discharge (ESD) event on the third conductor, wherein the ESD event is defined as an increase in voltage on the third conductor before the voltage pad receives the voltage from the external device, or before the I/O pad receives the signal.

The present disclosure also provides an IC that includes a trigger circuit configured to generate a trigger voltage VT in response to an electrostatic discharge (ESD) event, a plurality of metal oxide semiconductor (MOS) transistors coupled to the trigger circuit, wherein the plurality of MOS transistors are configured to conduct ESD current from a plurality of circuit nodes, respectively, to a first conductor in response to the trigger circuit generating the trigger voltage VT, and a conductor configured to provide the trigger voltage VT to substrate bodies of the plurality of MOS transistors. The IC of this embodiment may further include a second conductor for providing a voltage, an input/output (I/O) pad configured to receive a signal, wherein the plurality of MOS transistors include a plurality of NMOS transistors, respectively, wherein each of the plurality of NMOS transistors includes an isolated p-well in which a source and drain of the NMOS transistor are formed, wherein the conductor is configured to provide the trigger voltage VT to the isolated p-wells of the plurality NMOS transistors, wherein the drain and source of a first of the plurality of NMOS transistors are coupled to the second conductor and the first conductor, respectively, and wherein the drain and source of a second of the plurality of NMOS transistors are coupled to the I/O pad and the first conductor, respectively. The IC may further include a voltage pad coupled to the second conductor and configured to receive the voltage from a device external to the IC, wherein the trigger circuit is coupled between the second and first conductors, and wherein the ESD event may be defined as an increase in voltage on the second conductor before the voltage pad receives the voltage from the external device, or before the I/O pad receives the signal. In one embodiment, the drain of the second of the plurality of NMOS transistors is coupled to the I/O pad via a resistor. In another embodiment, the IC may further include second and third conductors, a voltage pad configured to receive a voltage from a device external to the IC, an input/output (I/O) pad configured to receive a signal, wherein the voltage pad is directly coupled to the third conductor and indirectly coupled to the second conductor via a diode, and wherein the trigger circuit is coupled between the second conductor and the ground conductor. A drain and source of a first of the plurality of MOS transistors in this embodiment is coupled to the third conductor and the first conductor, respectively, and a drain and source of a second of the plurality of MOS transistors is coupled to the I/O pad and the first conductor, respectively. Or a drain and source of a first of the plurality of MOS transistors is coupled to the second conductor and the first conductor, respectively, and a drain and source of a second of the plurality of MOS transistors is coupled to the I/O pad and the first conductor, respectively. In still another embodiment, the conductor of the IC is configured to provide the trigger voltage VT to the isolated p-wells of the plurality NMOS transistors via respective resistors.

Additionally the present disclosure provides an IC that includes a first pad configured to receive a signal, a first MOS transistor coupled to the first pad, wherein the first MOS transistor is configured to transition to snapback mode when voltage at the first pad exceeds a snapback trigger threshold for the first MOS transistor, a second MOS transistor coupled to a first conductor, wherein the second MOS transistor is configured to transition to snapback mode when voltage at the first conductor exceeds a snapback trigger voltage threshold for the second MOS transistor, a trigger circuit configured to generate a trigger voltage VT for lowering the first MOS transistor's snapback trigger voltage threshold and for lowering the second MOS transistor's snapback trigger voltage threshold, and a voltage limiter configured to limit the trigger voltage VT. The IC may further include a conductor, wherein the trigger circuit is configured to generate the trigger voltage VT in response to an electrostatic discharge (ESD) event, and wherein the conductor provides the trigger voltage to gates of the first and second MOS transistors.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. An integrated circuit (IC) comprising:
a trigger circuit configured to generate a trigger voltage VT in response to an electrostatic discharge (ESD) event;
a plurality of metal oxide semiconductor (MOS) transistors coupled to the trigger circuit, wherein the plurality of MOS transistors are configured to conduct ESD current from a plurality of circuit nodes, respectively, to a first conductor in response to the trigger circuit generating the trigger voltage VT;
a voltage limiter circuit configured to limit the trigger voltage VT.

2. The IC of claim 1 further comprising a conductor, wherein the conductor is configured to provide the trigger voltage VT to gates of the plurality of MOS transistors.

3. The IC of claim 2 wherein the plurality of MOS transistors comprise a plurality of NMOS transistors.

4. The IC of claim 3 further comprising:
a second conductor for providing a voltage;
an input/output (I/O) pad configured to receive a signal;
wherein a drain and a source of a first of the plurality of NMOS transistors are coupled to the second and the first conductor, respectively;
wherein a drain and source of a second of the plurality of NMOS transistors are coupled to the I/O pad and the first conductor, respectively.

5. The IC of claim 4 wherein the drain of the second of the plurality of NMOS transistors is coupled to the I/O pad via a resistor.

6. The IC of claim 4 further comprising:
a voltage pad coupled to the second conductor and configured to receive the voltage from a device external to the IC;
wherein the trigger circuit is coupled between the first and second conductors, and wherein the ESD event comprises an increase in voltage on the second conductor before the voltage pad receives the voltage from the external device, or before the I/O pad receives the signal.

7. The IC of claim 3 further comprising:
second and third conductors;
a voltage pad configured to receive a voltage from a device external to the IC;
an input/output (I/O) pad configured to receive a signal;
a diode coupled between the I/O pad and the third conductor;
wherein the voltage pad is directly coupled to the second conductor and indirectly coupled to the third conductor via another diode;
wherein the trigger circuit is coupled between the third conductor and the first conductor.

8. The IC of claim 7:
wherein a drain and source of a first of the plurality of NMOS transistors is coupled to the second conductor and the first conductor, respectively;
wherein a drain and source of a second of the plurality of NMOS transistors is coupled to the I/O pad and the first conductor, respectively.

9. The IC of claim 7:
wherein a drain and source of a first of the plurality of NMOS transistors is coupled to the third conductor and the first conductor, respectively;
wherein a drain and source of a second of the plurality of NMOS transistors is coupled to the I/O pad and the first conductor, respectively.

10. The IC of claim 7:
wherein the trigger circuit is configured to detect an electrostatic discharge (ESD) event on the third conductor;
wherein the ESD event comprises an increase in voltage on the third conductor before the voltage pad receives the voltage from the external device, or before the I/O pad receives the signal.

11. An integrated circuit (IC) comprising:
a trigger circuit configured to generate a trigger voltage VT in response to an electrostatic discharge (ESD) event;

a plurality of metal oxide semiconductor (MOS) transistors coupled to the trigger circuit, wherein the plurality of MOS transistors are configured to conduct ESD current from a plurality of circuit nodes, respectively, to a first conductor in response to the trigger circuit generating the trigger voltage VT;

a conductor configured to provide the trigger voltage VT to substrate bodies of the plurality of MOS transistors.

12. The IC of claim 11 further comprising:

a second conductor for providing a voltage;

an input/output (I/O) pad configured to receive a signal;

wherein the plurality of MOS transistors comprise a plurality of NMOS transistors, respectively;

wherein each of the plurality of NMOS transistors comprises an isolated p-well in which a source and drain of the NMOS transistor are formed, wherein the conductor is configured to provide the trigger voltage VT to the isolated p-wells of the plurality NMOS transistors;

wherein the drain and source of a first of the plurality of NMOS transistors are coupled to the second conductor and the first conductor, respectively;

wherein the drain and source of a second of the plurality of NMOS transistors are coupled to the I/O pad and the first conductor, respectively.

13. The IC of claim 12 further comprising:

a voltage pad coupled to the second conductor and configured to receive the voltage from a device external to the IC;

wherein the trigger circuit is coupled between the second and first conductors, and wherein the ESD event comprises an increase in voltage on the second conductor before the voltage pad receives the voltage from the external device, or before the I/O pad receives the signal.

14. The IC of claim 12 wherein the drain of the second of the plurality of NMOS transistors is coupled to the I/O pad via a resistor.

15. The IC of claim 11 further comprising:

second and third conductors;

a voltage pad configured to receive a voltage from a device external to the IC;

an input/output (I/O) pad configured to receive a signal;

wherein the voltage pad is directly coupled to the third conductor and indirectly coupled to the second conductor via a diode;

wherein the trigger circuit is coupled between the second conductor and the ground conductor.

16. The IC of claim 15:

wherein a drain and source of a first of the plurality of MOS transistors is coupled to the third conductor and the first conductor, respectively;

wherein a drain and source of a second of the plurality of MOS transistors is coupled to the I/O pad and the first conductor, respectively.

17. The IC of claim 15 wherein:

a drain and source of a first of the plurality of MOS transistors is coupled to the second conductor and the first conductor, respectively;

wherein a drain and source of a second of the plurality of MOS transistors is coupled to the I/O pad and the first conductor, respectively.

18. The IC of claim 12 wherein the conductor is configured to provide the trigger voltage VT to the isolated p-wells of the plurality NMOS transistors via respective resistors.

19. An integrated circuit (IC) comprising:

a first pad configured to receive a signal;

a first MOS transistor coupled to the first pad, wherein the first MOS transistor is configured to transition to snapback mode when voltage at the first pad exceeds a snapback trigger threshold for the first MOS transistor;

a second MOS transistor coupled to a first conductor, wherein the second MOS transistor is configured to transition to snapback mode when voltage at the first conductor exceeds a snapback trigger voltage threshold for the second MOS transistor;

a trigger circuit configured to generate a trigger voltage VT for lowering the first MOS transistor's snapback trigger voltage threshold and for lowering the second MOS transistor's snapback trigger voltage threshold;

a voltage limiter configured to limit the trigger voltage VT.

20. The IC of claim 19 further comprising:

a conductor;

wherein the trigger circuit is configured to generate the trigger voltage VT in response to an electrostatic discharge (ESD) event;

wherein the conductor provides the trigger voltage to gates of the first and second MOS transistors.

* * * * *